(12) United States Patent
Spence et al.

(10) Patent No.: US 6,171,739 B1
(45) Date of Patent: Jan. 9, 2001

(54) METHOD OF DETERMINING FOCUS AND COMA OF A LENS AT VARIOUS LOCATIONS IN AN IMAGING FIELD

(75) Inventors: Christopher A. Spence, Sunnyvale; Regina T. Schmidt, Milpitas, both of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/205,792

(22) Filed: Dec. 4, 1998

(51) Int. Cl.[7] .................................................. G03F 9/00
(52) U.S. Cl. .................................................. 430/30
(58) Field of Search ................................ 430/30, 5, 322, 430/327

(56) References Cited

U.S. PATENT DOCUMENTS

| | | | |
|---|---|---|---|
| 5,202,748 | 4/1993 | MacDonald et al. | 356/360 |
| 5,242,770 | * 9/1993 | Chen et al. | 430/5 |
| 5,766,806 | 6/1998 | Spence | 430/5 |
| 5,807,649 | 9/1998 | Liebmann et al. | 430/5 |
| 5,840,447 | * 11/1998 | Peng | 430/5 |
| 5,976,740 | * 11/1999 | Ausschnitt et al. | 430/30 |
| 6,011,611 | * 1/2000 | Nomura et al. | 355/67 |

OTHER PUBLICATIONS

Regina Schmidt, Chris Spence, Luigi Capodieci, Zoran Krivokapic, Bernd Geh, Doris Flagello. "Impact of Coma on CD Control for Multiphase PSM Designs." Mar. 1998. SPIE vol. 3334, pp. 15–24.

* cited by examiner

Primary Examiner—Christopher G. Young
Assistant Examiner—Saleha R. Mohamedulla
(74) Attorney, Agent, or Firm—Renner, Otto, Boisselle & Sklar, LLP

(57) ABSTRACT

A method of determining at least one of focus and coma of a lens at a selected location in an imaging field, includes the step of forming a predetermined pattern on a mask for transference to a wafer through a lens. The pattern including a plurality of features such that a first of the plurality of features is situated adjacent a first side of a first phase shift region formed on the mask, and a second of the plurality of features is situated adjacent a second side of a second phase shift region formed on the mask, the second side being substantially opposite the first side. The method further includes the steps of transferring the pattern formed on the mask to the wafer, measuring a dimension of each of a first structure and a second structure formed on the wafer, the first structure being formed as a result of the first feature being transferred from the mask to the wafer and the second structure being formed as a result of the second feature being transferred from the mask to the wafer, and using the measured dimensions to determine the at least one of focus and coma of the lens at the selected location.

27 Claims, 10 Drawing Sheets

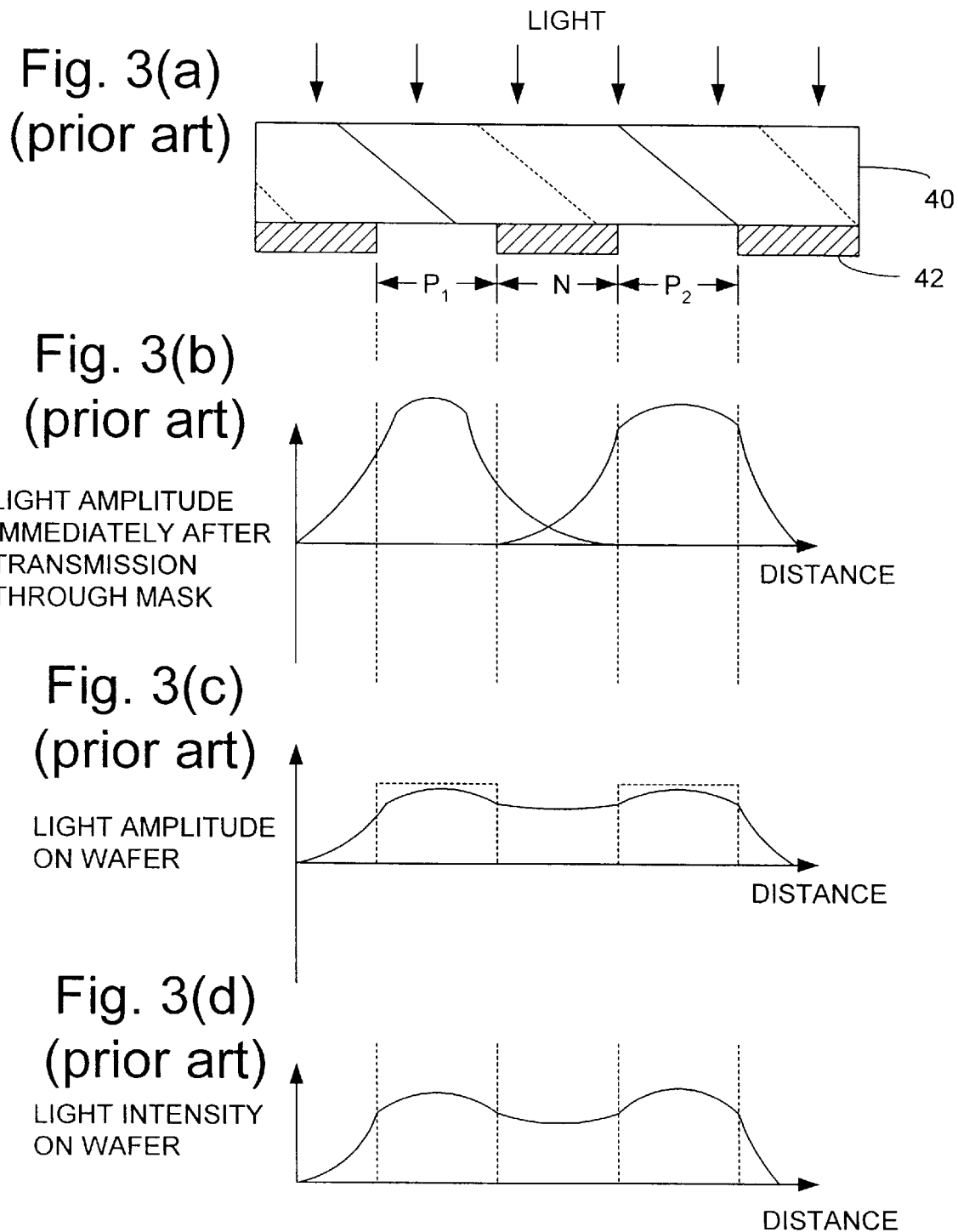

METHOD OF DETERMINING FOCUS AND COMA OF A LENS AT VARIOUS LOCATIONS IN AN IMAGING FIELD

TECHNICAL FIELD

The present invention generally relates to the lithographic patterning of a semiconductor wafer. In particular, the present invention relates to a method for characterizing the focus and coma of a lens used in the production of the semiconductor wafer at various locations in an imaging field.

BACKGROUND OF THE INVENTION

Referring initially to FIG. 1a, integrated circuits are formed on semiconductor wafers 10 typically made from silicon. The wafers 10 are substantially round and typically have a diameter of approximately 15 to 20 cm. Each wafer 10 is divided up into individual circuit die 15 which contain an integrated circuit. Since a single integrated circuit die 15 is often no more than 1 cm$^2$, a great many integrated circuit die 15 can be formed on a single wafer 10. After the wafer 10 has been processed to form a number of integrated circuit die on its surface, the wafer 10 is cut along scribe lines 20 to separate the integrated circuit die for subsequent packaging and use.

Formation of each integrated circuit die on the wafer is accomplished using photo-lithography. In general, lithography refers to processes for pattern transfer between various media. The basic photo-lithography system consists of a light source, a photomask containing the pattern to be transferred to the wafer, a collection of lenses, and a means for aligning existing patterns on the wafer with patterns on the photomask.

Referring to FIG. 1b, during an intermediate stage in the manufacturing cycle, the wafer 10 is shown to include a film 25 which overlies the wafer 10 and a resist 30 disposed on the film 25. Exposing the resist 30 to light or radiation of an appropriate wavelength through the photomask causes modifications in the molecular structure of the resist polymers to allow for transfer of the pattern from the photomask to the resist 30. The modification to the molecular structure allows a resist developer to dissolve and remove the resist in exposed areas, presuming a positive resist is used. If a negative resist is used, the developer removes the resist in the unexposed areas.

Referring to FIG. 1c, once the resist 30 on the wafer has been developed, one or more etching steps take place which ultimately allow for transferring the desired pattern to the wafer 10. For example, in order to etch the film 25 disposed between the resist 30 and the wafer 10, an etchant is applied over the patterned resist 30. The etchant comes into contact with the underlying film layer by passing through openings 35 in the resist formed during the resist exposure and development steps. Thus, the etchant serves to etch away those regions of the film layer which correspond to the openings in the resist, thereby effectively transferring the pattern in the resist to the film layer as illustrated in FIG. 1d. In subsequent steps, the resist is removed and another etchant may be applied over the patterned film layer to transfer the pattern to the wafer or to another layer in a similar manner.

Presently, there are a variety of known techniques for transferring a pattern to a wafer using photolithography. For instance, referring to FIG. 2, a reduction step-and-repeat system 50 (also called a reduction stepper system 50) is depicted. The reduction stepper system 50 uses refractive optics to project a mask image onto a resist layer 30. The reduction stepper system 50 includes a mirror 55, a light source 60, a filter 65, a condenser lens system 70, a mask 75, a reduction lens system 80, and the wafer 10. The mirror 55 behaves as a collecting optics system to direct as much of the light from the light source 60 (e.g. a mercury-vapor lamp) to the wafer 10. The filter 65 is used to limit the light exposure wavelengths to the specified frequencies and bandwidth. The condenser system 70 focuses the radiation through the mask 75 and to the reduction lens system to thereby focus a "masked" radiation exposure onto one of the circuit die 15.

Since it is complex and expensive to produce a lens capable of projecting a mask of an entire wafer, the reduction stepper system 50, projects an image only onto a portion of the wafer 10 corresponding to an individual circuit die 15. This image in then stepped and repeated across the wafer 10 in order to transfer the pattern to the entire wafer 10 (and thus the name "stepper"). Consequently, the size of the wafer is no longer a consideration for the system optics.

Current reduction stepper systems 50 utilize masks that contain a pattern that is an enlargement of the desired image on the wafer 10. Consequently, the mask pattern is reduced when projected onto the resist 30 during exposure (and thus the name "reduction stepper").

With an ever increasing number of integrated circuit patterns being formed on a circuit die, the importance of properly designing patterns to form structures that are isolated and non-interfering with one another has also increased. Accordingly, when designing a pattern to place on a mask, it is of significant benefit to know in advance the amount of error to expect with respect to the corresponding structures formed on the wafer so that such error can be accounted for in advance.

One known source for errors introduced during the patterning of the resist on a wafer occurs due to diffraction effects caused during the passage of light through the pattern formed on the mask. In particular, light which passes adjacent an edge of a pattern formed on the mask is caused to diffract by the edge thereby scattering the light in multiple directions. As a result the light intensity on the resist is not perfectly binary in nature.

For example, referring to FIGS. 3(a)–3(c) the diffraction affects of light passing through mask 40 having a patterned chrome layer 42 formed thereon is depicted. In particular, as the apertures P1 and P2 in FIG. 3(a) become closer to one another to allow for more tightly packed features on the wafer, the amplitude of light incident on the wafer in regions not corresponding to the apertures P1 and P2 increases. The degree to which the light amplitude in various regions varies due to the diffraction affects can be seen by comparing the light amplitude curve immediately after transmission through the mask in FIG. 3(b) with the light amplitude curve on the wafer in FIG. 3(c). For comparison purposes, an ideal light amplitude curve is also depicted in FIG. 3(c) in dotted lines. From the light amplitude curve shown in FIG. 3(c), the light intensity curve shown in FIG. 3(d) may be derived. In particular, the light intensity is proportional to the square of the resultant amplitude. As the resist is sensitive to the light intensity incident thereon, it can be seen from FIG. 3(d) that the resist will not have the desired sharp contrast resolution in the region between P1 and P2.

In order to reduce the affects of the diffracted light, a phase shift mask (PSM) has been utilized. In a PSM, phase variations are produced in the light that passes through the mask material. The phase variations are achieved by modifying the length that a light beam travels through the mask material.

In particular, referring to FIGS. 4(a)–4(d) two different method of achieving phase shift masking is depicted. In FIG. 4(a) the light passing through region P2 is caused to pass through additional mask material via deposited layer 47. In FIG. 4(b), the light in region P2 traverses through a shorter distance by virtue of etched groove 48. Each of the phase shift masks in FIGS. 4(a) and 4(b) make use of the fact that light passing through the mask material exhibits a wave characteristic such that the phase of the amplitude of the light exiting from the mask material is a function of the distance the light ray travels in the mask material, i.e. thicknesses t1 and t2. By making the thickness t2 such that $(n-1)(t2)$ is approximately equal to $\frac{1}{2}\lambda$, where $\lambda$ is the wavelength of the light in the mask material, and n=refractive index of the added or subtracted material, then the amplitude of the light exiting from the aperture P2 is opposite in phase from the light exiting aperture P1. This is illustrated in FIG. 4(c), showing the effects of diffraction and use of interference cancellation. As mentioned above, the resist is responsive to the intensity of the light at the wafer. Thus, since the opposite phases of light cancel where they overlap and since intensity is proportional to the square of the resultant amplitude, as seen in FIG. 4(d), contrast resolution is significantly improved.

While using a PSM can enhance process latitude at one point in the imaging field, it is also of significance to determine if a PSM can provide enhanced process latitude at all points across a field of view of a lens used in the photolithographic process. In particular, it is of particular interest to determine whether lens aberrations may improve or worsen CD control as compared to masks phase shifting characteristics (also known as binary masks). For example, a lens aberration known as coma which is caused by the distortion of a lightwave as it encounters an optic asymmetry, may add to CD variations across an imaging field during exposure of the resist to light using a PSM. Further, it is of interest also to measure the focus of the lens at the different locations across the imaging field so as to characterize the lens so that known variations can be accounted for during wafer design and manufacture.

Accordingly, there is a strong need in the art for a method of accurately and quickly measuring the affects of coma and focus at various locations in an imaging field.

SUMMARY OF THE INVENTION

When forming structures on a wafer using a PSM, it has been observed that the line width (hereinafter referred to as "critical dimensions" or "CDs") of a structure formed on the wafer varies depending on whether a phase shifter is to the right or left of the corresponding feature on the mask. For instance, an isolated line, which is a line that is at least a predetermined distance from any other structure on the wafer, may be classified as a isolated left line or an isolated right line depending on whether it was produced from a feature on the mask having a phase shifter to its left or right, respectively. It has been observed that an isolated left line and an isolated right line which are produced from features on the mask which are identical except for the side to which the phase shifters are situated with respect to the features, exhibit different line width characteristics upon being formed on the wafer. Further, it has been observed that by measuring the line width difference between an isolated left line and an isolated right line formed in a region relatively close to one another in the imaging field, the result can be used to determine the focus and coma of a lens used in the photo-lithographic process at that location.

It has also been observed that there is a difference in line width between a pair of lines formed on the wafer from corresponding features on the mask having a phase shifter disposed between the features. The pair of lines and corresponding features on the mask are differentiated from the isolated lines by virtue of the pair of lines being within a predetermined distance from one another. By measuring the difference in line width between the pair of lines formed from identically shaped features on the mask having a phase shifter therebetween, a change in CD can be determined. It has been found that the change in CD divided by coma of a lens used to produce the pair of lines (i.e. $\Delta CD_{p1}$/coma) is a constant value equal to K1 and does not vary as a function of focus. Accordingly, by forming a combination of both isolated lines and pairs of lines at various locations throughout an imaging field and measuring CDs at the locations, it is possible to characterize the lens aberrations for focus and coma at any location in the imaging field.

In order to characterize the lens for focus and coma at various locations in an imaging field, an initial calibration step is completed during which time the coma of a particular lens is determined at a given location using known coma calibration techniques. Next, CD measurements are taken of a pair of lines formed on the wafer in order to find $\Delta CD_{p1}$. As discussed above, for a pair of lines the equation $\Delta CD_{p1}$/coma has been found to be a constant K1, and since coma is known, K1 can readily be determined. Accordingly, the coma of the lens at any point in the imaging field can be determined by measuring the $\Delta CD_{p1}$ between a pair of lines at the desired location and dividing by the known constant K1. Alternatively, the sensitivity of the test structure to coma could be determined using computer simulation or the like.

In order to find focus at any location in the imaging field, the $\Delta CD_{i1}$ between an isolated right line and an isolated left line at a particular location is initially obtained. The $\Delta CD_{i1}$/coma for the isolated lines is a function of the focus of the lens times a constant (e.g. $\Delta CD_{i1}$/coma=K2*focus) wherein $\Delta CD_{i1}$=CD isolated right line-CD isolated left line. As discussed above, the coma value for any place in the imaging field can be determined by measuring the $\Delta CD_{p1}$ between a pair of lines and dividing by the known constant K1. Further, K2 can be determined by setting the focus of the stepper equipment to various different focus settings and taking appropriate measurements. Alternatively, K2 may be determined during an initial calibration step in which the focus of a lens at the desired location is determined using known calibration techniques. Accordingly, the focus of the lens in any place in the imaging field can thereafter be determined. In particular the focus is determined by measuring $\Delta Cd_{i1}$ for isolated lines at the desired location and dividing this value by both the coma at the desired location and the constant K2.

Thus, according to the present invention, upon performing an initial calibration step in which certain constants are determined, it is possible to characterize a lens for both focus and coma at any point in the imaging field by simply measuring the change in CD between a pair of lines and between two isolated lines formed on the wafer at the location in which the lens characterization is desired. In this way, a simple, accurate and reliable method of characterizing a lens throughout an imaging field is possible.

According to one aspect of the present invention, a method of determining at least one of focus and coma of a lens at a selected location in an imaging field is provided. The method includes the steps of forming a predetermined pattern on a mask for transference to a wafer through a lens, the pattern including a plurality of features such that a first of the plurality of features is situated adjacent a first side of a first phase shift region formed on the mask, and a second of the plurality of features is situated adjacent a second side of a second phase shift region formed on the mask, the second side being substantially opposite the first side, transferring the pattern formed on the mask to the wafer, measuring a dimension of each of a first structure and a second structure formed on the wafer, the first structure being formed as a result of the first feature being transferred from the mask to the wafer and the second structure being formed as a result of the second feature being transferred from the mask to the wafer, and using the measured dimensions to determine the at least one of focus and coma of the lens at the selected location.

In accordance with another aspect of the present invention, a method of determining at least one of focus and coma of a lens at a selected location in an imaging field is provided. The method includes the steps of, forming a predetermined pattern on a mask for transference to a wafer through a lens, the pattern including a plurality of features such that a first of the plurality of features is situated adjacent a first side of a first phase shift region formed on the mask, and a second of the plurality of features is situated adjacent a second side of the first phase shift region formed on the mask, the second side being substantially opposite the first side, transferring the pattern formed on the mask to the wafer, measuring a dimension of each of a first structure and a second structure formed on the wafer, the first structure being formed as a result of the first feature being transferred from the mask to the wafer and the second structure being formed as a result of the second feature being transferred from the mask to the wafer, and using the measured dimensions to determine the at least one of focus and coma of the lens at the selected location.

In accordance with yet another aspect of the present invention, a stepper system includes a semiconductor wafer, a mask and a lens interposed between the wafer and the mask. A method of determining at least one of focus and coma of the lens at a desired location in an imaging field includes the steps of forming a pattern on the mask, the mask including a phase shifter to the right of a first line of the pattern, a phase shifter to the left of a second line of the pattern, and a phase shifter between third and fourth lines of the pattern, transferring the pattern on the mask to a resist overlying the wafer, forming first, second, third and fourth structures on the wafer which respectively correspond to the first, second, third and fourth lines of the pattern, determining a first value equal to a difference between a line width of the third and fourth structures, using the first value to determine the coma of the lens, determining a second value equal to a difference between a line width of the first and second structures, and using a combination of the coma and the second value to determine the focus of the lens.

To the accomplishment of the foregoing and related ends, the invention then, comprises the features hereinafter fully described and particularly pointed out in the claims. The following description and the annexed drawings set fourth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

BRIEF DESCRIPTION OF THE DRAWINGS

In the annexed drawings:

FIGS. 3(a) to 3(d) are schematic representations of diffraction effects using a prior art binary mask;

DETAILED DESCRIPTION OF THE INVENTION

The present invention will now be described with respect to the accompanying drawings in which like numbered elements represent like parts.

According to the present invention, both the focus and coma of a lens used in photo-lithographic patterning of a semiconductor wafer can be determined at any place in the imaging field (also known as the stepper field) by measuring the difference in line width between certain test structures. The test structures are at least two structures which were formed from corresponding features on a PSM mask in which a phase shifter was oriented to the right of one of the features and to the left of another of the features. Based on observations made by the inventors of the present invention, the line width differences can be used to calculate the focus and coma of the lens situated between the mask and the wafer.

Figure 5:
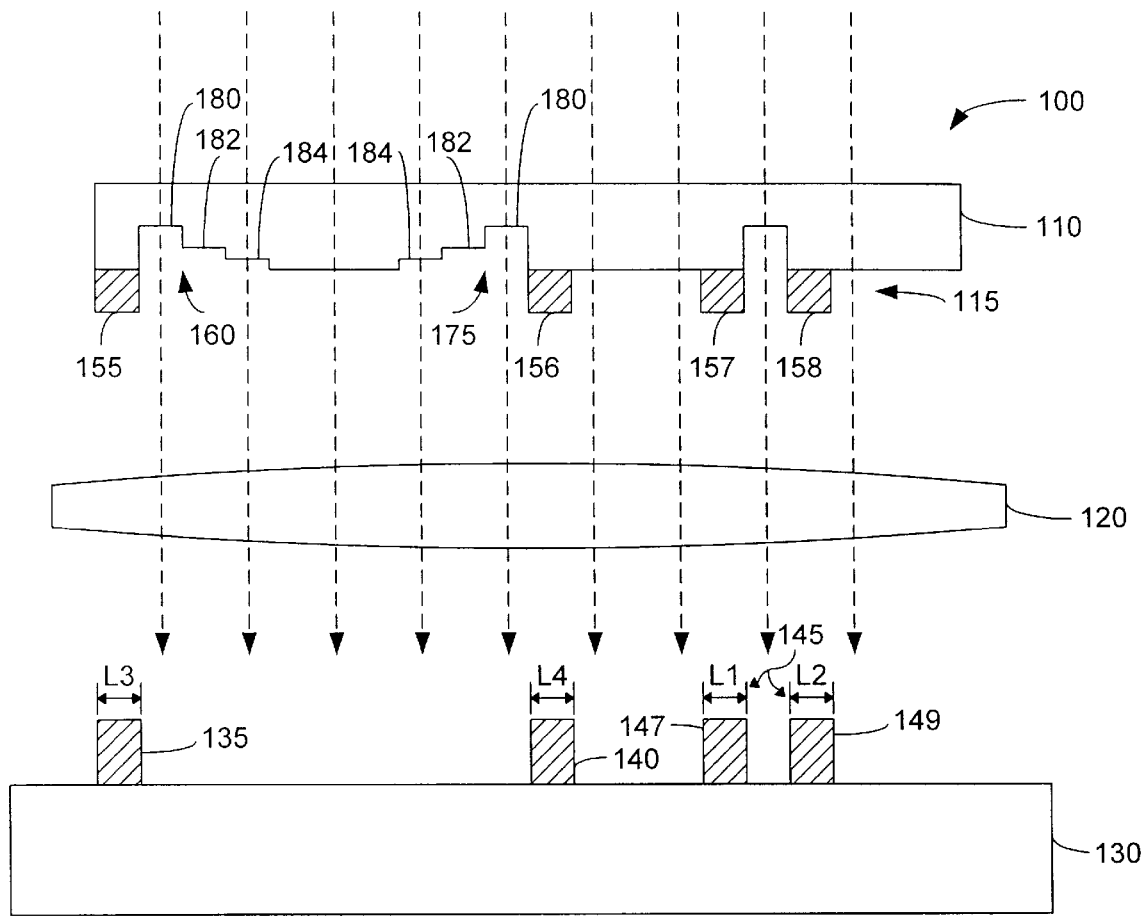
FIG. 5 is a system view of a mask used to transfer a pattern to a wafer through a lens in accordance with the present invention.

Referring initially to FIG. 5, a stepper system 100 is depicted in which mask 110 is etched to provide phase shifting for light traveling therethrough. Although the present embodiment depicts a mask having etched portions for providing phase shifting, it will be appreciated that deposited material could alternatively be used. The mask 110 includes a feature layer 115 for transferring a pattern formed therein through a reduction lens 120 to a resist (not shown) and subsequently to a film layer 125 which overlies wafer 130. In the present embodiment, the mask 110 is formed of quartz, however, it will be appreciated that glass or other known reticle materials could alternatively be used. The feature layer 115 is made of chrome and is patterned using conventional techniques. For example, the feature layer 115 may be patterned by initially forming a photoresist (not shown) over the feature layer 115, patterning the photoresist using an electron beam, and then etching the feature layer 115 through the patterned photoresist. While in the present embodiment, the feature layer 115 is made of chrome, it will be appreciated that other known mask materials could alternatively be used.

Figure 6:
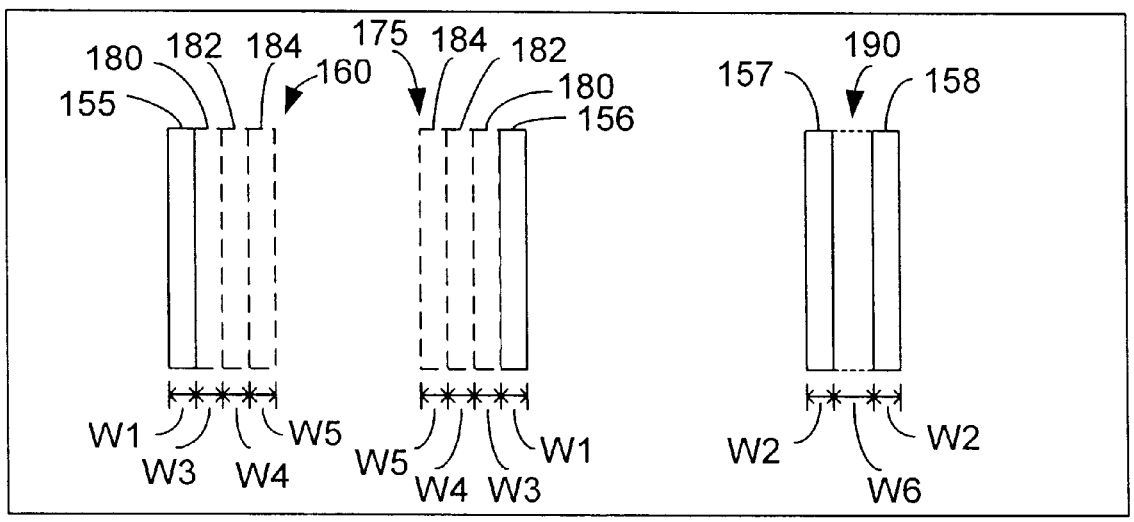
FIG. 6 is a top view of the mask shown in FIG. 5.

As shown in FIGS. 5 and 6, the feature layer 115 is patterned to form several test features 155, 156, 157, and 158. As will be discussed in more detail below, feature 155 corresponds to an isolated right line 135 formed on the wafer 130, feature 156 corresponds to an isolated left line 140 formed on the wafer 130, and features 157 and 158 correspond to a pair of lines 145 formed on the wafer 130. In the preferred embodiment, each set of isolated lines 135, 140 used in calculating the focus and/or coma of the lens 120 have corresponding features 155, 156 of identical width. Similarly, each pair of lines 145 have corresponding features 157, 158 of identical width. Thus, as seen in FIG. 6, features 155 and 156 each have a width of W1, while features 157 and 158 have a width of W2. In the present embodiment, both widths W1 and W2 are set at 0.25 microns, although such widths may independently vary from one application to another.

While in the present embodiment the features 155–158 are shown to be rectangular in shape and of equal length, it will be appreciated that features of various sizes and shapes could alternatively be used. For example, square, circular, bent, or angled features could be utilized. Additionally, various features may be oriented in different directions on the same mask. For example, features may be oriented in any of a horizontal, vertical, radial, sagittal or other direction. The primary concern in selecting the size and shape of features corresponding to isolated lines or a pair of lines is that there is at least some dimensional measurement that can be taken along the corresponding structures formed from the features that can be compared to determine the effects of focus and coma of the lens as described herein.

As briefly mentioned above, the pattern formed in the film 125 following exposure and etching steps is shown to include the isolated right line 135, the isolated left line 140 and the pair of lines 145. In general, an isolated line is any line or structure which is a predetermined distance away from any other structure on the wafer 130. In the present embodiment, the predetermined distance away on the wafer is approximately 2 microns or more for a feature on the mask 110 having a feature width (W1) of approximately 0.25 at an exposure wavelength in the deep-UV range (e.g. 248 nm). Of course, the predetermined distance for an isolated line will vary depending on the feature width (W1) and exposure wavelength of light or radiation used to produce the isolated line. An isolated right line is a line or structure formed on or in the wafer 130 by a feature on the mask 110 having a phase shifter to the right. For example, in the present embodiment, the feature 155 formed on the mask 110 has phase shifter 160 to its right thereby forming isolated right line 135 on the wafer 130. An isolated left line is a line or structure formed on or in the wafer by a feature on the mask 110 having a phase shifter to the left. For example, in the present embodiment, the feature 156 formed on the mask 110 has phase shifter 175 to its left thereby forming isolated left line 140 on the wafer 130.

The pair of lines 140 includes a right line 147 and a left line 149. The convention for naming structure 147 to be the "right line" and structure 149 to be the "left line" results from the orientation of their corresponding features 157, 158 to a phase shifter 190 therebetween. In particular, the phase shifter 190 is to the right of the feature 157 which forms the right line 147 and phase shifter 190 is to the left of the feature 158 which forms the left line 149. In addition to being formed from features on the mask 110 having a phase shifter disposed therebetween, each of the pair of lines 145 is also situated to be within a predetermined distance from one another. In the present embodiment, the predetermined distance on the wafer is between 0.2 and 0.5 microns and in the present embodiment is approximately 0.4 microns. Of course, similar to the isolated line, the predetermined distance for a pair of lines will vary depending on the feature width of each line and the exposure wavelength of light or radiation used to produce the pair of lines. While conventions for defining what is meant by right lines, left lines, isolated right line and isolated left line have been provided for sake of discussion, it will be appreciated that the conventions for naming is not critical to the present invention and names or labels may be swapped from one application to another.

Continuing to refer to FIGS. 5 and 6, the right and left phase shifters 160, 175, respectively are shown to be multiphased in that each provides staggered phase shift masking of light traveling therethrough. In particular, each phase shifter 160, 175 respectfully includes a first etched region 180 having a width W3 approximately equal to 0.4 microns and providing a 180° phase shift, a second etched region 182 having a width W4 approximately equal to 0.2 microns and providing a 120° phase shift, and a third etched region 184 having a width W5 approximately equal to 0.2 microns and providing a 60° phase shift. Depending on the width W3 of the 180° phase shift region 180, the slope of the curve $\Delta Cd_{i1}/coma$ will vary as a function of focus as discussed in more detail below with respect to FIG. 8. By comparison, phase shifter 190 formed between patterns 157 and 158 which are used to form the pair of lines 145 provides a single 180° phase shift. In the present embodiment, the phase shifter 190 has a width W6 approximately equal to 0.4 microns.

While it is preferable that each phase shifter 160, 175 used to form the isolated lines be multiphased as described herein, it will be appreciated that non-multiphased phase shifters and/or phase shifters providing other phase shift amounts can alternatively be used.

The inventors of the present invention have observed that, with respect to the isolated lines 135, 140, the CD of a structure formed on the wafer 130 varies depending on whether a phase shifter 160, 175 is to the right or left of the corresponding pattern 155, 156 on the mask 110. In particular, it has been observed that the CDs of isolated lines such as lines 135 and 140 vary as a function of both focus and coma of the lens 120. Further, with respect to a pair of lines, it has been observed that a change in CD divided by coma ($\Delta CD_{p1}/coma$) between a pair of lines 145 is a constant K1 (wherein K1 is an integer number) and does not vary as a function of focus. Accordingly, by forming a combination of both isolated lines and pairs of lines at various locations throughout an imaging field and measuring CDs at the various locations, it is possible to characterize the lens aberrations for focus and coma at any location in the imaging field.

In order to provide support for the proposition that CDs of isolated lines vary as a function of focus and coma depending on whether a phase shifter is to the right or left of corresponding pattern on the mask or reticle which forms the lines, the inventors of the present invention performed a simulation experiment. In particular, the CDs of an isolated left line and an isolated right line were measured at eight different coma and focus settings. The features on the mask from which the isolated left line and isolated right line were formed substantially were identical in size and shape. The measured CD for the isolated left line and the isolated right line were then plotted against coma. Also, the change in CD or $\Delta Cd_{i1}$ ($\Delta Cd_{i1}$=CD of isolated right line-CD of isolated left line) was plotted against coma. The results of the experiment is shown in FIG. 7.

Figure 7:
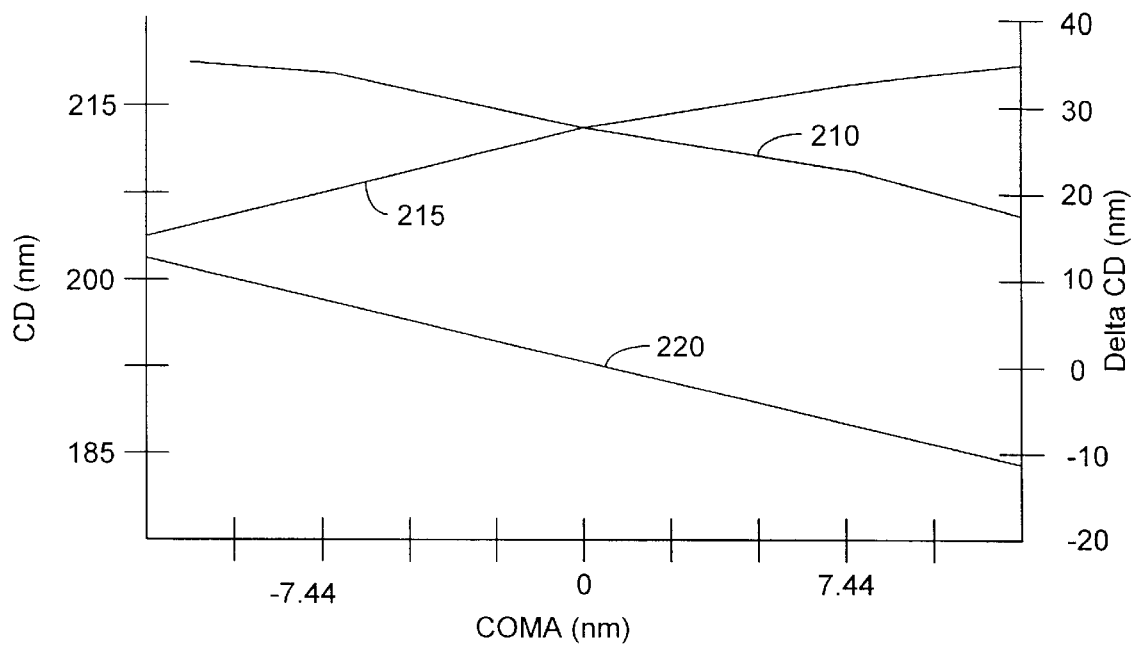
FIG. 7 is a graph plotting the line width of a left isolated line, the line width of a right isolated line, and a difference between the line widths of the left isolated line and right isolated line against coma in accordance with the present invention.

As can be seen from the results in FIG. 7, at any given coma setting except zero, an isolated line formed by a mask feature having phase shifter to the right as represented by line 210 had a different CD than an isolated line formed by a substantially identically shaped mask feature having a phase shifter to the left as represented by line 215. For instance, at a coma setting of −7.44, the isolated right line had a CD of approximately 210 nm while the isolated left line had a CD of approximately 216 nm. Further, as coma varied the $\Delta Cd_{i1}$ of the isolated lines also varied in a substantially linear fashion as represented by line 220. Accordingly, it can be seen from FIG. 3 that not only does the placement of phase shifters to the right or left of a feature on a mask affect CDs of corresponding lines formed on the wafer, but also that as coma varies, the CDs of such lines also vary in a predictable manner.

Figure 8:
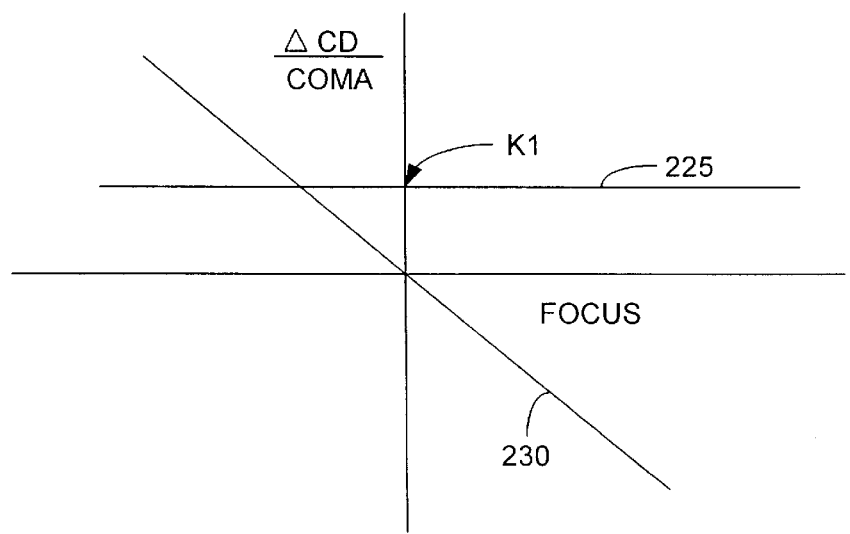
FIG. 8 is a graph plotting the change in CD divided by coma against focus for both a pair of lines and isolated left and right lines in accordance with the present invention.

Referring now to FIG. 8, a further experiment was conducted in which the $\Delta CD$/coma for both isolated lines and a pair of lines was plotted against focus. Again, the isolated lines and pair of lines were formed by features on the mask being substantially identical in shape. As can be seen from the results of this experiment, with respect to the pair of lines as represented by line 225, the $\Delta CD_{p1}$/coma was substantially constant and independent of the focus. In particular, it was determined that $\Delta CD_{p1}$/coma for a pair of lines was substantially equal to a constant K1 for any focus (i.e. $\Delta Cd_{p1}$/coma=K1). By comparison, FIG. 8 shows that $\Delta Cd_{i1}$/coma for the isolated lines as represented by line 230 varied linearly with focus. In particular, it was determined from this graph that $\Delta Cd_{i1}$/coma for isolated lines is equal to a constant K2 times focus (i.e. $\Delta Cd_{i1}$/coma=K2*focus), wherein K2 is an integer number. Depending on the width W3 of the 180° etched region 180 (FIG. 6), the inventors have found that the slope of $\Delta Cd_{i1}$/coma for isolated lines varies. For example, when keeping the 120° etched region 182 and 60° etched region 184 of constant width, it has been found that at a width W3 of 0.5 μm or greater, the $\Delta Cd_{i1}$/coma is less than 0.8 nm/nm at any focus. At narrower widths for W3, the sensitivity to coma has been found to increase dramatically. For example, at width W3 of 0.25 μm the $\Delta Cd_{i1}$/coma varied from 1.5 nm/nm at a focus of −0.8 μm to −1.5 nm/nm at a focus of 0.6 μm. Accordingly, depending on the desired sensitivity to coma, the width of the etched region 180 may be varied from one application to the next.

Based on the forgoing observations, the inventors of the present invention have determined a method for finding both the focus and coma of the lens 120 anywhere in the imaging field. The method will now be described with respect to FIG. 9.

Figure 9:
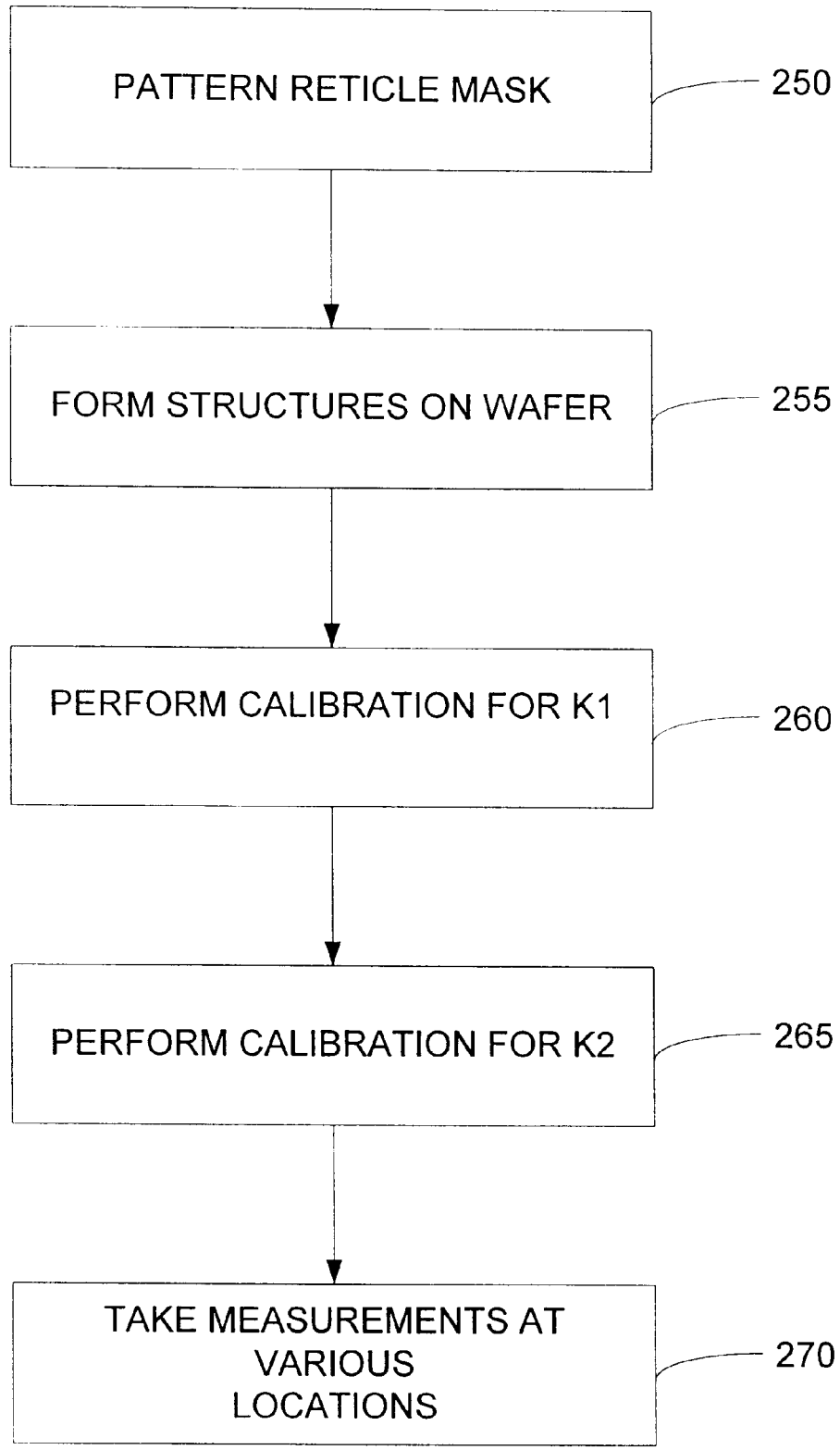
FIG. 9 is a flow chart illustrating the steps taken to determine focus and coma of a lens at various locations in a imaging field in accordance with the present invention.
Figure 10:
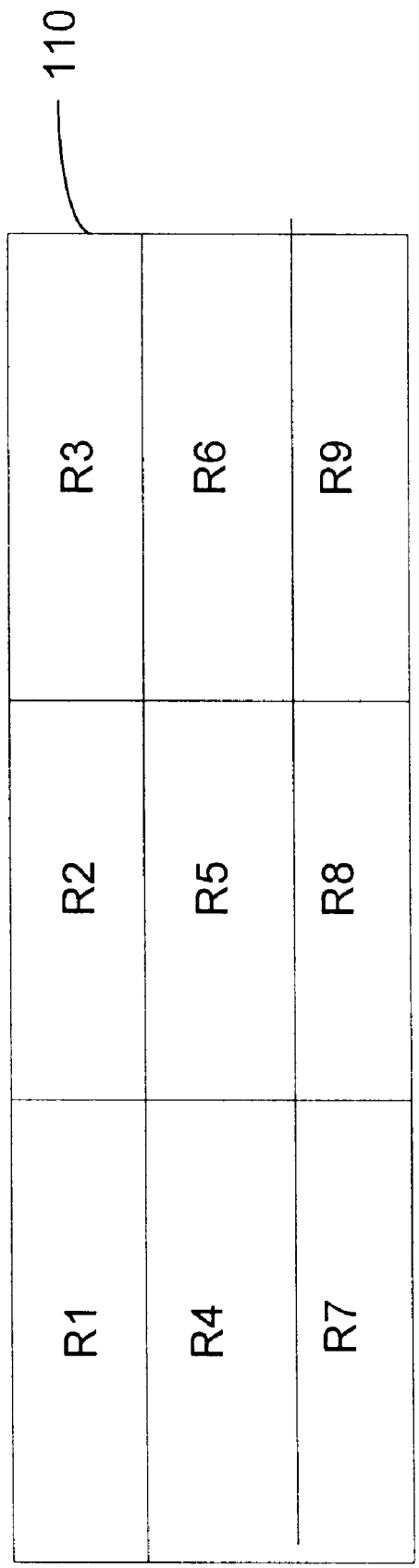
FIG. 10 is a diagrammatic view of various regions in which the mask of the present invention may be divided in order to determine focus and coma of the lens in corresponding regions on the wafer in accordance with the present invention.

In particular, referring to step 250 in FIG. 9, the mask 110 is initially patterned to provide a feature layer 115 having various regions in which features corresponding to isolated lines and a pair of line is formed. For example, referring to FIG. 10, the mask 110 is divided into 9 regions labeled R1–R9. Within each region, R1–R9, features are formed in the feature layer 115 of the mask 110 so as to produce an isolated left line, an isolated right line and a pair of lines in a corresponding location on the wafer 10. For example, as discussed above with respect to FIGS. 5 and 6, features 155, 156, would be formed in each region along with their corresponding phase shifters 160 and 175, respectively, and features 157 and 158 would also be formed in each region along with phase shifter 190. By forming the features in each region R1–R9, the corresponding test structures formed on the wafer can be used to calculate the focus and coma of the lens 120 in that region of the imaging field.

Next, in step 255, the features formed on the mask 110 is transferred to the wafer 130 using conventional photolithography techniques. For instance, the features formed in the feature layer 115 may be transferred to a resist overlying the film layer 125 on the wafer 130. Subsequently, the resist is developed, the film layer is etched, and the resist is removed thereby forming the patterned film layer 125 as depicted in FIG. 5.

Figure 1A:
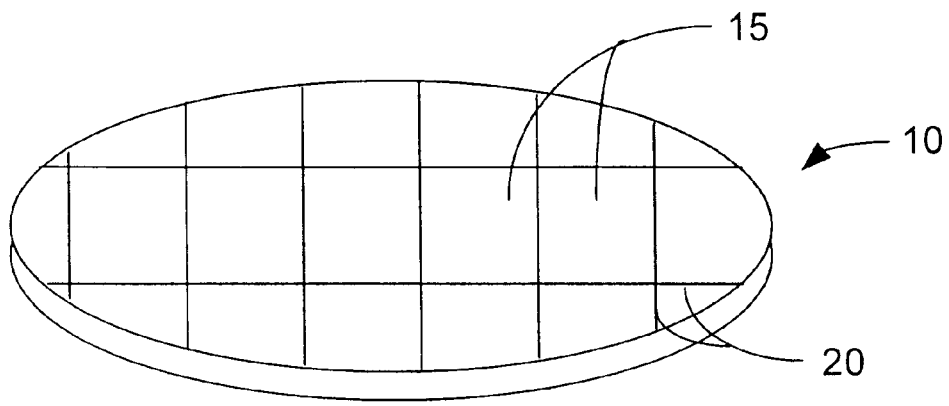
FIG. 1a is a diagrammatic view of a prior art semiconductor wafer having a circuit die formed thereon.
Figure 1B:
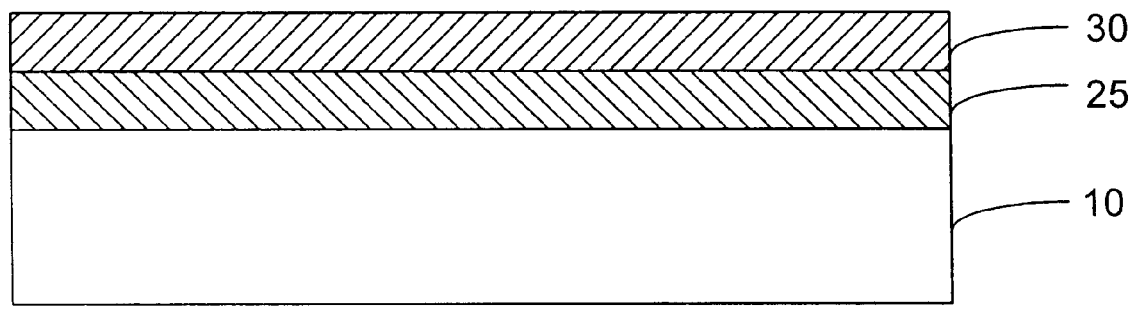
FIG. 1b is a partial cross section illustrating a prior art semiconductor wafer having a film overlying the wafer which in turn is covered by a resist layer.
Figure 1C:
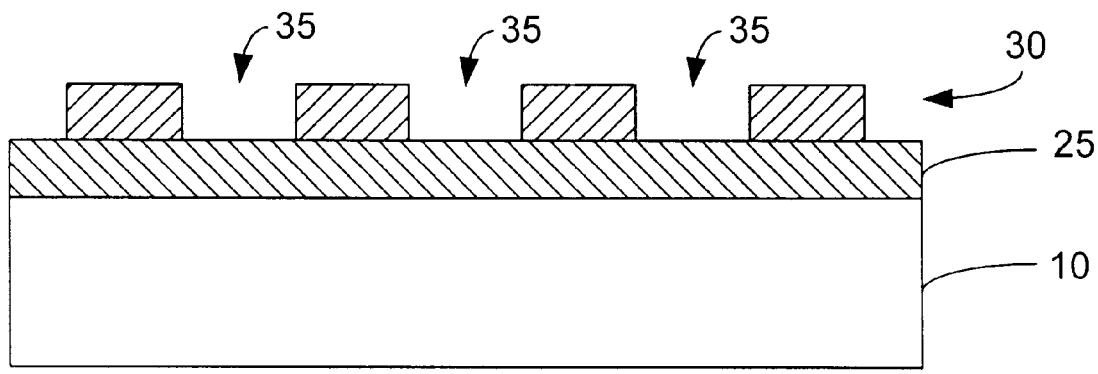
FIG. 1c is a partial cross section illustrating the resist layer of FIG. 1b after being developed.
Figure 1D:
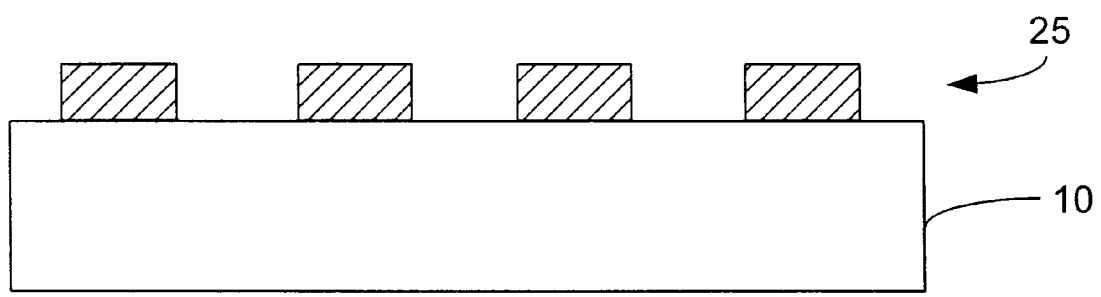
FIG. 1d is a partial cross section illustrating the film layer of FIG. 1c after being etched.
Figure 2:
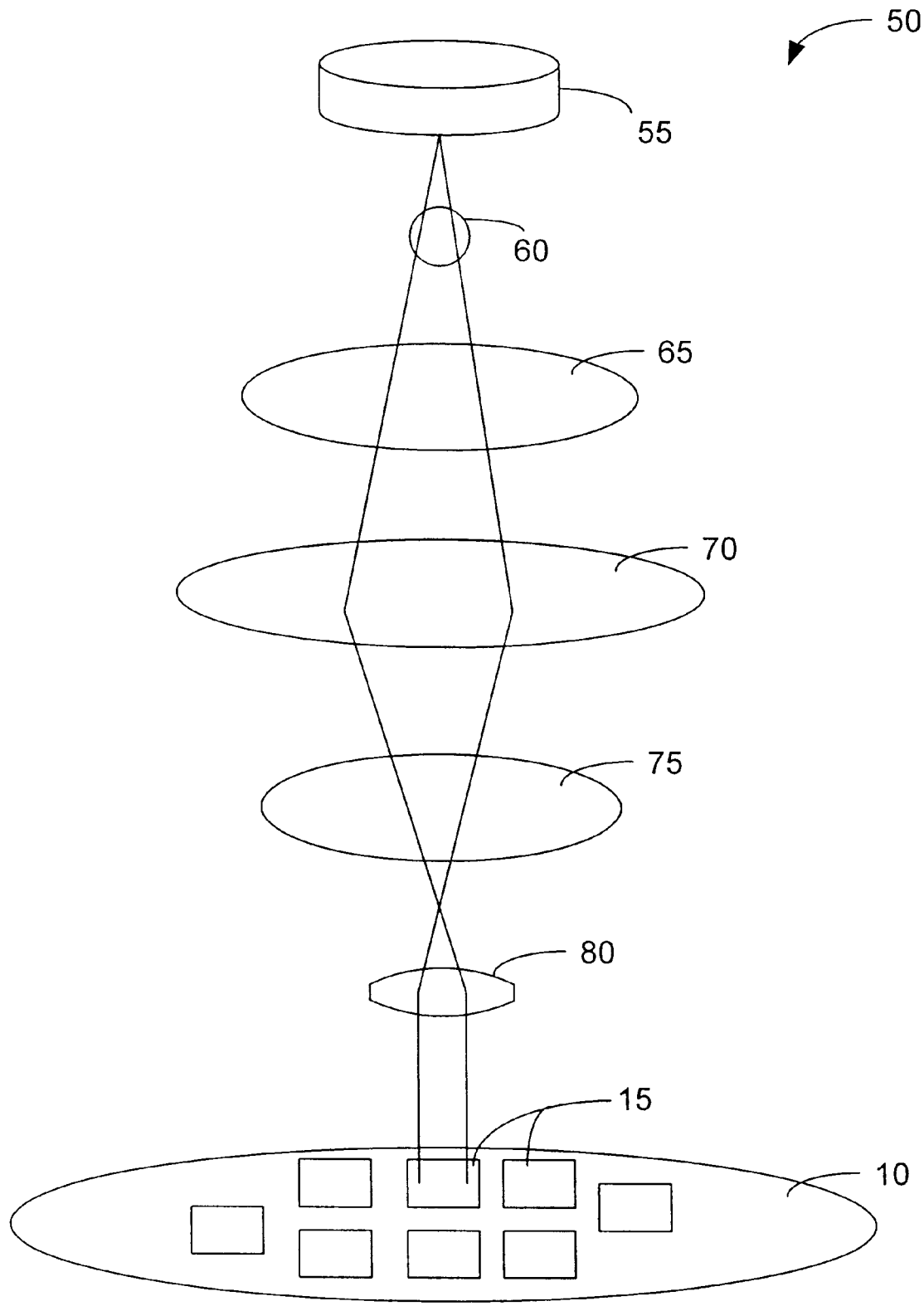
FIG. 2 is a system view of a prior art reduction stepper wherein refractive optics are used to transfer a pattern to a circuit die on a wafer.
Figure 4A:
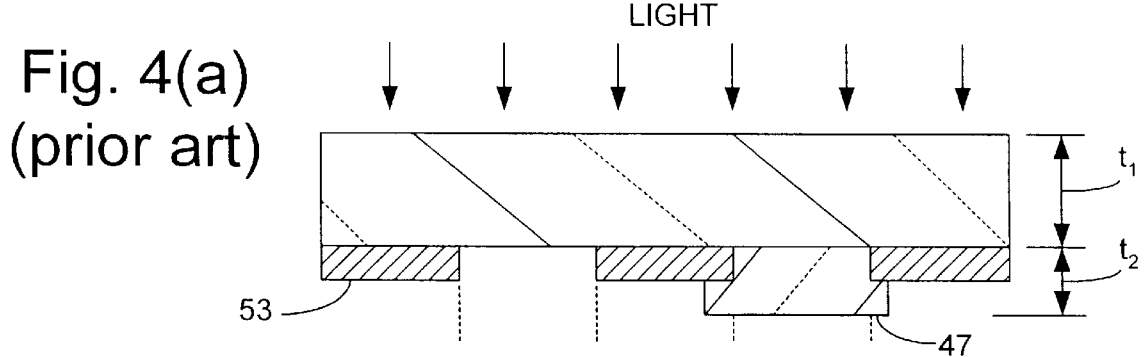
FIGS. 4(a) to 4(d) are schematic representations of diffraction effects and the use of phase shift masking to compensate for the effects of diffraction.
Figure 4B:
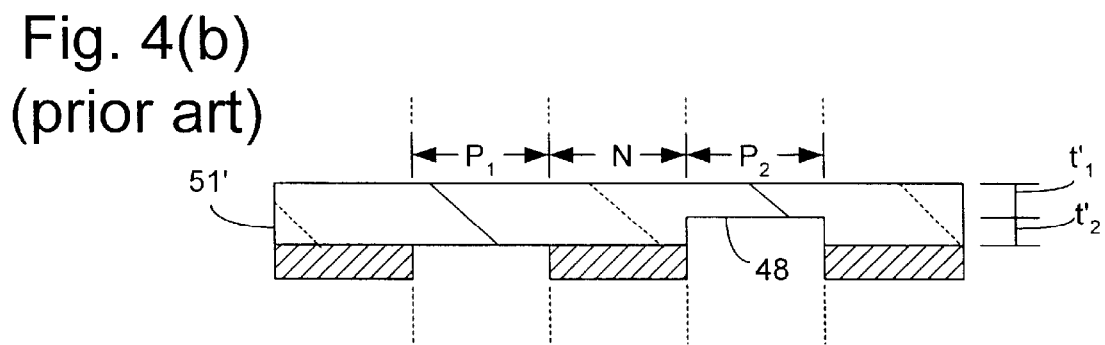
Figure 4C:
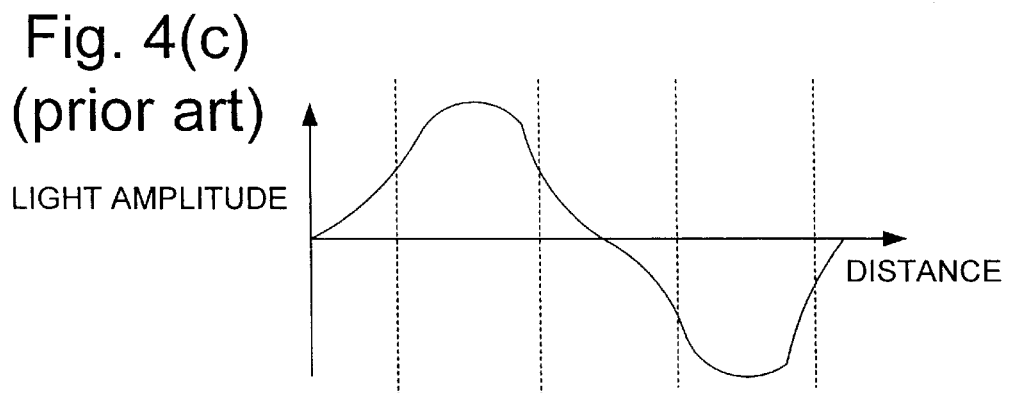
Figure 4D:
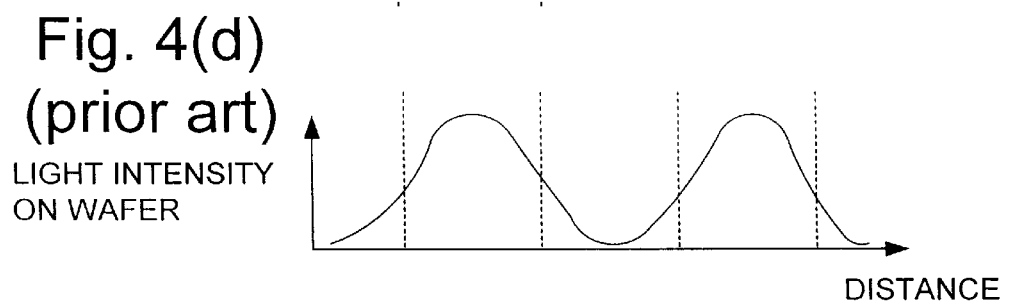

Following step 255, an initial calibration step is conducted in step 260 wherein the value of the constant K1 is determined. In particular, for a selected pair of lines formed on the wafer 130, a coma value for the lens at that location is determined using conventional calibration techniques known in the art. Next, the $\Delta CD_{p1}$ between the selected pair of lines is calculated. For example, as shown in FIG. 2, $\Delta CD_{p1}$ for the pair of lines 145 can be calculated by measuring the line width L1 for line 147 and line width L2 for line 149 and taking the difference (e.g. $\Delta CD_{p1}$=L1−L2). Measurement of L1 and L2 can be taken using any of a variety of conventionally known line width measurement techniques such as by use of an electron microscope. As discussed above, for a pair of lines the following formula holds true: $\Delta CD_{p1}$/coma=K1. Thus, by finding coma and $\Delta CD_{p1}$ during the calibration step, the value of K1 can be determined. In turn, the value for coma at any other location in the imaging field can be determined by calculating the $\Delta CD_{p1}$ for the desired location and dividing the result by K1.

Next, in step 265 an additional calibration step to determine the value of the constant K2 is conducted. In order to find the value of the constant K2 from the equation for isolated lines of $\Delta CD_{i1}$/coma=K2*focus, the coma and focus at a selected calibration location needs to be determined. In order to find the coma value at the calibration location, the $\Delta CD_{p1}$ for the pair of lines located proximate the calibration location is first determined in accordance with the technique described above. Next, the coma for the calibration location can be determined by dividing the $\Delta CD_{p1}$ by K1 found in the previous step 260. The focus for the calibration location is then determined using one of a variety of known techniques in the art. Once the coma and focus are determined, the $\Delta CD_{i1}$ for the isolated lines is calculated. For example, referring to FIG. 5, the $\Delta CD_{i1}$ is found by subtracting the line width L4 of the isolated left line 140 from the line width L3 of the isolated right line 135 (e.g. $\Delta CD_{i1}$=L4−L3). As will be appreciated, once the $\Delta CD_{i1}$, coma, and focus at the calibration location are determined, the equation $\Delta CD_{i1}$/coma=K2*focus can readily be solved for K2. Alternatively, K2 can be determined by setting the focus of the stepper system 100 to several different known focus settings and solving for K2 using techniques known in the art.

Once K1 and K2 have been determined, the focus and coma at any location in the imaging field can be determined by measuring the $\Delta CD_{p1}$ and $\Delta CD_{i1}$ at each of the desired locations. In particular, in step 270 at each location in which the isolated lines and pair of lines was formed, the coma of the lens 120 at that location is first determined by measuring the $\Delta CD_{p1}$ at that location and solving for coma using the equation $\Delta CD_{p1}$/coma=K1. Once coma is determined, the focus of the lens 120 at the desired location is also determined by measuring the $\Delta CD_{i1}$ at the location and then solving for focus using the equation $\Delta CD_{i1}$/coma= K2*focus. Accordingly, by appropriately positioning both isolated lines and pairs of lines at various locations throughout an imaging field, the lens 120 can be accurately and efficiently characterized for both focus and coma.

The invention has been described with reference to the preferred embodiments. Obviously, modifications and alterations will occur to others upon reading and understanding the preceding detailed description. For example, while in the preferred embodiment, both isolated lines and a pair of lines is formed in each location so that both coma and focus can be determined, it will be appreciated that a given location may only include a pair of lines or isolated lines in order to find either one of focus or coma. Additionally, it will be appreciated that while the preferred embodiment has been described with respect to a stepper system in which a reticle is used to project an image onto a circuit die, the present invention is suitable in any lithographic system using a mask or reticle to transfer an image to a wafer through a lens. Furthermore, it will be appreciated that while the preferred embodiments depict forming two lines or structures on a wafer that are substantially parallel to one another to find either $\Delta CD_{p1}$ or $\Delta CD_{i1}$, three or more line or structures having various orientation with one another could alternatively be used in combination to find either one or both of focus and coma. It is intended that the invention be construed as including all such modifications alterations, and equivalents thereof and is limited only by the scope of the following claims.

What is claimed is:

1. A method of determining at least one of focus and coma of a lens at a selected location in an imaging field, the method comprising the steps of:

forming a predetermined pattern on a mask for transference to a wafer through a lens, the pattern including a plurality of features such that a first of the plurality of features is situated adjacent to and a first direction relative to a first phase shift region formed on the mask, and a second of the plurality of features is situated adjacent to and a second direction relative to a second phase shift region formed on the mask, the second direction being substantially opposite the first direction;

transferring the pattern formed on the mask to the wafer;

measuring a dimension of each of a first structure and a second structure formed on the wafer, the first structure being formed as a result of the first feature being transferred from the mask to the wafer and the second structure being formed as a result of the second feature being transferred from the mask to the wafer; and using a difference in the measured dimensions, due to the directions of the first and second features relative to the respective first and second phase shift regions, to determine the at least one of focus and coma of the lens at the selected location.

2. The method of claim 1, wherein the first structure and second structures are lines, and the measured dimension is a width of each of the lines.

3. The method of claim 1, wherein the first feature and the second feature are substantially identically shaped.

4. The method of claim 1, wherein the first structure and second structure are at least 2 microns or more from any other structure on the wafer.

5. The method of claim 4, wherein the first phase shift region and the second phase shift region each provides multiphase phase shifts.

6. The method of claim 5, wherein the multiphase phase shifts include phase shifts of 180°, 120°, and 60°.

7. The method of claim 4, wherein the using the measured dimensions to determine the at least one of focus and coma of the lens includes determining a constant value K2 (wherein K2 is an integer number) during an initial calibration step using a known or experimentally derived value for focus, the determining the constant value K2 including using the relationship that the difference between the measured dimensions of the first and second structures divided by coma is equal to the focus at the location times the constant value K2.

8. The method of claim 7, wherein the first and second structures are lines and the dimension is a width of each of the lines.

9. The method of claim 1, wherein the first structure and the second structure are between approximately 0.2 and 0.5 microns apart.

10. The method of claim 9, wherein the first phase shift region and the second phase shift region are the same region.

11. The method of claim 10, wherein the phase shift region provides a 180° phase shift.

12. The method of claim 10, wherein the using the measured dimensions includes calculating coma using a difference between the measured dimensions of the first and second structures.

13. The method of claim 12, wherein the using the measured dimensions to determine the at least one of focus and coma of the lens includes determining a constant value K1 (wherein K1 is an integer number) during an initial calibration step using a known or experimentally derived value for coma, the determining the constant value K1 including using the relationship that the difference between the measured dimensions of the first and second structures divided by coma is equal to the constant value K1.

14. The method of claim 13 wherein the first and second structures are lines and the dimension is a width of each of the lines.

15. The method of claim 1, wherein the plurality of features further includes a third feature and a fourth feature situated adjacent to and in opposite directions relative to a third phase shift region, the third feature corresponding to a third structure formed on the wafer and the fourth feature corresponding to a fourth structure formed on the wafer.

16. The method of claim 15, wherein the first and second structures are at least 2 microns or further from any other feature on the mask, and the third and fourth structures are between 0.2 and 0.5 microns apart from one another, and method further including the steps of:

measuring a dimension of each of the third structure and the fourth structure formed on the wafer, the third structure being formed as a result of the third feature being transferred from the mask to the wafer and the fourth structure being formed as a result of the fourth feature being transferred from the mask to the wafer.

17. The method of claim 16, wherein the step of using the measured dimensions to determine the at least one of focus and coma of the lens includes the steps of:

determining a difference between the measured dimensions of the third and fourth structures;

using the difference between the measured dimensions of the third and fourth structures to calculate coma;

determining a difference between the measured dimensions of the first and second structures; and using the difference between the measured dimensions of the first and second structures and the calculated coma to calculate focus.

18. The method of claim 17, wherein the first, second, third and fourth structures are lines and the dimension is a width of each of the lines.

19. A method of determining at least one of focus and coma of a lens at a selected location in an imaging field, the method comprising the steps of:

forming a predetermined pattern on a mask for transference to a wafer through a lens, the pattern including a plurality of features such that a first of the plurality of features is situated adjacent to and a first direction relative to a first phase shift region formed on the mask, and a second of the plurality of features is situated adjacent to and a second direction relative to the first phase shift region formed on the mask, the second direction being substantially opposite the first direction;

transferring the pattern formed on the mask to the wafer;

measuring a dimension of each of a first structure and a second structure formed on the wafer, the first structure being formed as a result of the first feature being transferred from the mask to the wafer and the second structure being formed as a result of the second feature being transferred from the mask to the wafer; and using a difference in the measured dimensions, due to the directions of the first and second features relative to the respective first and second phase shift regions, to determine the at least one of focus and coma of the lens at the selected location.

20. The method of claim 19, wherein the first structure and second structures are lines, and the measured dimension is a width of each of the lines.

21. The method of claim 20, wherein the first structure and the second structure are between approximately 0.2 and 0.5 microns apart from one another.

22. The method of claim 21, wherein the step of using the measured dimensions to determine the at least one of focus and coma of the lens includes the step of calculating a value representative of a difference between the width of the lines and using the value to determine the coma of the lens.

23. In a stepper system including a semiconductor wafer, a mask and a lens interposed between the wafer and the mask, a method of determining at least one of focus and coma of the lens at a desired location in an imaging field, the method comprising the steps of:

forming a pattern on the mask, the mask including a first phase shifter to the right of a first line of the pattern, a second phase shifter to the left of a second line of the pattern, and a third phase shifter between third and fourth lines of the pattern;

transferring the pattern on the mask to a resist overlying the wafer;

forming first, second, third and fourth structures on the wafer which respectively correspond to the first, second, third and fourth lines of the pattern;

determining a first value equal to a difference between a line width of the third and fourth structures;

using the first value to determine the coma of the lens;

determining a second value equal to a difference between a line width of the first and second structures; and using a combination of the coma and the second value to determine the focus of the lens.

24. The method of claim 23, wherein the first structure is an isolated right line and the second structure is an isolated left line, and the first and second structures are formed at least 2 microns or further from any other structure on the wafer.

25. The method of claim 23, wherein the third and fourth structures are a pair of lines and are within a predetermined distance from one another of approximately between 0.2 and 0.5 microns.

26. The method of claim 25, wherein the first and second phase shifters are multiphase phase shifters.

27. The method of claim 23, wherein the pattern formed on the mask is formed of chrome.

* * * * *